United States Patent [19]
Ishibashi et al.

[11] Patent Number: 5,818,096
[45] Date of Patent: Oct. 6, 1998

[54] PIN PHOTODIODE WITH IMPROVED FREQUENCY RESPONSE AND SATURATION OUTPUT

[75] Inventors: Tadao Ishibashi, Kanagawaken; Tomofumi Furuta, Tokyo; Naofumi Shimizu, Isehara; Koichi Nagata, Yamato; Yutaka Matsuoka, Atsugi; Masaaki Tomizawa, Isehara, all of Japan

[73] Assignee: Nippon Telegraph and Telephone Corp., Tokyo, Japan

[21] Appl. No.: 832,297

[22] Filed: Apr. 3, 1997

[30] Foreign Application Priority Data

Apr. 5, 1996 [JP] Japan .................................. 8-083704
Feb. 13, 1997 [JP] Japan .................................. 9-028682

[51] Int. Cl.$^6$ ...................... H01L 31/075; H01L 31/105; H01L 31/117; H01L 31/107
[52] U.S. Cl. ........................................... 257/458; 257/438
[58] Field of Search ...................................... 257/458, 438

[56] References Cited

U.S. PATENT DOCUMENTS

| | | |
|---|---|---|
| 5,252,142 | 10/1993 | Matsuyama et al. . |
| 5,576,559 | 11/1996 | Davis . |
| 5,654,578 | 8/1997 | Watanabe . |

OTHER PUBLICATIONS

IEICE Trans.Electron, vol. E76–C, No. 2, Feb. 1993, entitled "Design of Ultrawide–Band, High–Sensitivity p–i–n Protedetectors", by Kazutoshi Kato, et al., pp.214 to 221.

Electronics Letters, dated Feb. 28, 1980, vol. 16, No. 5, entitled InGaAs Avalanche Photodiode with InP p–n Junction. by Kanbe, et al., Jan. 22, 1980, pp. 163 to 165.

Japanese Journal of Applied Physics, vol. 19, No. 6, Jun. 1980, entitled "Tunneling Current in InGaAs and Optimum Design for IngaAs/InP Avalanche Photodiode", by Ando, et al., pp. L277 to L280.

IEECE Journal of Quantum Electronics vol. QE–17, No. 2, dated Feb. 1981, entitled "A $Ga_{0.47}In_{0.53}As$/InP Heterophotodiode with Reduced Dark Current", by Thomas P. Pearsall et al., pp. 255 to 259.

IEEE Transactios on Electron Devices vol. 40 No. 11, dated Nov. 1993, entitled "Monte Carlo Analysis of Nonequilibrium Electron Transport in InAlGaAs/InGHaAs–HBT's", by Nakajima, pp. 1950 to 1956; and.

IRE Transactions on Electron Devices, entitled "A Theory of Transistor Cutoff Frequency (f) Falloff At High Current Densities," by C. T. Kirk, dated May 15, 1961, pp. 164 to 174.

*Primary Examiner*—Stephen Meier
*Attorney, Agent, or Firm*—Banner & Witcoff Ltd

[57] ABSTRACT

A pin photodiode having a structure capable improving the frequency response and the saturation output while maintaining the effective internal quantum efficiency and CR time constant. A pin photodiode is formed by: a first semiconductor layer in a first conduction type; a second semiconductor layer in a second conduction type; a third semiconductor layer sandwiched between the first and second semiconductor layers, having a doping concentration lower than those of the first and second semiconductor layers; a fourth semiconductor layer in the first conduction type, provided at one side of the first semiconductor layer opposite to a side at which the third semiconductor layer is provided; and a cathode electrode and an anode electrode connected directly or indirectly to the second semiconductor layer and the fourth semiconductor layer, respectively. The first semiconductor layer has a bandgap energy by which a charge neutrality condition is maintained in at least a part of the first semiconductor layer and the first semiconductor layer is made to function as a light absorption layer, while the second and third semiconductor layers have bandgap energies by which the second and third semiconductor layers are made not to function as a light absorption layer, and the fourth semiconductor layer has a bandgap energy greater than that of the first semiconductor layer.

7 Claims, 9 Drawing Sheets

11— p-TYPE LIGHT ABSORPTION LAYER
12— n-TYPE ELECTRODE LAYER
13— CARRIER TRAVELING LAYER
14— p-TYPE CARRIER BLOCK LAYER
15— ANODE ELECTRODE
16— CATHODE ELECTRODE
17— SEMI-INSULATING SUBSTRATE

11 — p-TYPE LIGHT ABSORPTION LAYER
12 — n-TYPE ELECTRODE LAYER
13 — CARRIER TRAVELING LAYER
14 — p-TYPE CARRIER BLOCK LAYER
15 — ANODE ELECTRODE
16 — CATHODE ELECTRODE
17 — SEMI-INSULATING SUBSTRATE

21 --- p-TYPE $In_{0.53}Ga_{0.47}As$ LIGHT ABSORPTION LAYER
22 --- n-TYPE InP ELECTRODE LAYER
23 --- UNDOPED InP CARRIER TRAVELING LAYER
24 --- p-TYPE $In_{0.73}Ga_{0.27}As_{0.6}P_{0.4}$ CARRIER BLOCK LAYER
25 --- ANODE ELECTRODE

31 ··· p-TYPE InGaAsP LIGHT ABSORPTION LAYER WITH GRADED BANDGAP
32 ··· n-TYPE InP ELECTRODE LAYER
33 ··· UNDOPED InP CARRIER TRAVELING LAYER
34 ··· p-TYPE $In_{0.73}Ga_{0.27}As_{0.6}P_{0.4}$ CARRIER BLOCK LAYER
35 ··· ANODE ELECTRODE

41 ··· p-TYPE $In_{0.53}Ga_{0.47}As$ LIGHT ABSORPTION LAYER WITH GRADED DOPING CONCENTRATION
42 ··· n-TYPE InP ELECTRODE LAYER
43 ··· UNDOPED InP CARRIER TRAVELING LAYER
44 ··· p-TYPE $In_{0.73}Ga_{0.27}As_{0.6}P_{0.4}$ CARRIER BLOCK LAYER
45 ··· ANODE ELECTRODE

51··· p-TYPE $In_{0.53}Ga_{0.47}As$ LIGHT ABSORPTION LAYER
52··· n-TYPE InP ELECTRODE LAYER
53··· UNDOPED InP CARRIER TRAVELING LAYER
54··· p-TYPE $In_{0.73}Ga_{0.27}As_{0.6}P_{0.4}$ CARRIER BLOCK LAYER
55··· ANODE ELECTRODE
56··· DEFORMED BAND PROFILE IN OPERATION STATE

101··· p-TYPE ELECTRODE LAYER
102··· n-TYPE ELECTRODE LAYER
103··· CARRIER TRAVELING LAYER (SIMULTANEOUSLY FUNCTIONING AS LIGHT ABSORPTION LAYER)
105··· ANODE ELECTRODE
106··· CATHODE ELECTRODE
107··· SEMI-INSULATING SUBSTRATE

PIN PHOTODIODE WITH IMPROVED FREQUENCY RESPONSE AND SATURATION OUTPUT

BACKGROUND OF THE INVENTION

1. Field of the Invention

The present invention relates to a long wavelength, broad bandwidth photodiode using III–V compound semiconductors, especially InGaAsP.

2. Description of the Background Art

A long wavelength (1.3 to 1.5 μm band), broad bandwidth photodiode is usually in a form of a pin photodiode using InGaAs as a light absorption layer, and this light absorption layer is also used as a carrier traveling region for inducing currents. Here, the InGaAs light absorption layer is designed to be depleted in its operation state so that the generated carriers can be accelerated by the electric field quickly. As for the structure, the so called double hetero-pin-structure in which the InGaAs light absorption layer is sandwiched by p-type and n-type InP is used. The known examples include a surface illuminated diode structure using the InGaAs light absorption layer with a thickness of about 0.2 μm, and an ordinary waveguide diode structure, both with 3 dB bandwidth (f3 d B) equal to 110 GHz.

The major factors for limiting the bandwidth include a lowering of the frequency response due to the carrier traveling and the CR time constant (where C is a diode junction capacitance, R is an diode parasitic resistance+line characteristic impedance). The capacitance changes in conjunction with a change of the light absorption layer thickness, so that there is a carrier traveling time vs. CR time constant tradeoff. Because of this relationship, in the surface illuminated diode structure, there exists a light absorption layer thickness for which the bandwidth becomes largest for a given diode Junction area. In addition, when the light absorption layer thickness decreases, the carrier traveling time is improved but the internal quantum efficiency is lowered, so that there is also a carrier traveling time vs. internal quantum efficiency tradeoff.

In the waveguide diode structure, the light is introduced along the waveguide, so that there is an advantage that the internal quantum efficiency can be made higher compared with that in the surface illuminated structure diode, and therefore the carrier traveling time vs. internal quantum efficiency tradeoff can be alleviated. The carrier traveling time vs. CR time constant tradeoff, however, is basically unchanged.

Hence, it is difficult to significantly enhance the frequency response (3 dB bandwidth: f3 d B ) while maintaining the quantum efficiency and the CR time constant in the surface illuminated diode structure (or while maintaining the CR time constant in the waveguide diode structure), unless the carrier traveling velocity is increased. This fact is basically stemming from the properties of the semiconductors. Namely, the direct transition III–V compound semiconductors have a property that the drift velocity of holes is much lower than that of electrons, and for this reason the effective carrier traveling velocity is dominated by the hole drift velocity. In other words, even though the electron drift velocity is fast, the carrier traveling time determined by holes is actually the fundamental problem in this type of photodiode.

On the other hand, an increase of a possible output current is also an important factor in the application of the photodiode to an optical communication receiver, etc. In order to achieve a high output, it is necessary to increase the carrier concentration in the carrier traveling region. However, a response of a diode is degraded in a case of high light power input because of an influence of an electric field modulation due to a generation of internal space charges. Namely, the residual hole concentration becomes higher than the electron concentration and the electric field of the traveling layer is flattened by their positive charges, so that the hole extraction becomes poor. Here, again, the limiting mechanism relates to the fact that the hole drift velocity is slow.

SUMMARY OF THE INVENTION

It is therefore an object of the present invention to provide a pin photodiode having a device structure capable of improving the frequency response and the saturation output while maintaining the effective internal quantum efficiency and CR time constant.

According to one aspect of the present invention there is provided a pin photodiode with a semiconductor pn junction structure, comprising: a first semiconductor layer in a first conduction type; a second semiconductor layer in a second conduction type; a third semiconductor layer sandwiched between the first and second semiconductor layers, having a doping concentration lower than those of the first and second semiconductor layers; a fourth semiconductor layer in the first conduction type, provided at one side of the first semiconductor layer opposite to a side at which the third semiconductor layer is provided; and a cathode electrode and an anode electrode connected directly or indirectly to the second semiconductor layer and the fourth semiconductor layer, respectively; wherein the first semiconductor layer has a bandgap energy by which a charge neutrality condition is maintained in at least a part of the first semiconductor layer and the first semiconductor layer is made to function as a light absorption layer; the second and third semiconductor layers have bandgap energies by which the second and third semiconductor layers are made not to function as a light absorption layer; and the fourth semiconductor layer has a bandgap energy greater than that of the first semiconductor layer.

Other features and advantages of the present invention will become apparent from the following description taken in conjunction with the accompanying drawings.

DETAILED DESCRIPTION OF THE PREFERRED EMBODIMENTS

Figure 1A:
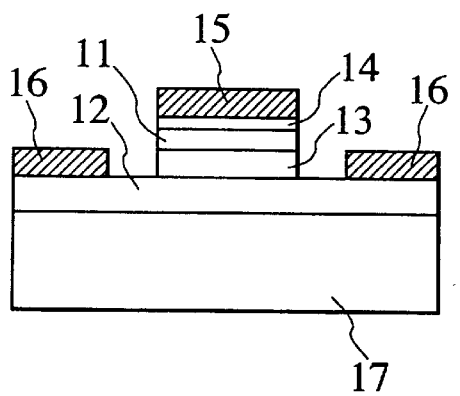
FIG.1A is a cross sectional view of a basic configuration of a pin photodiode in a surface illuminated structure according to the present invention.
Figure 1B:
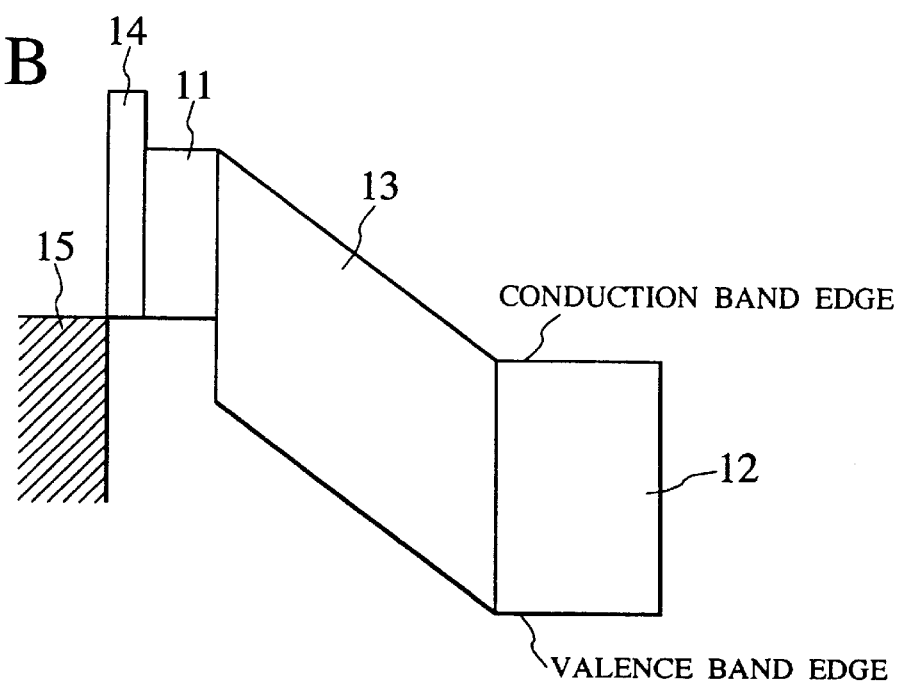
FIG. 1B is a band diagram for the pin photodiode shown in FIG. 1A.

Referring now to FIGS. 1A and 1B, the basic features of a pin photodiode according to the present invention will be described.

FIGS. 1A and 1B show a basic configuration of a photodiode according to the present invention, where FIG. 1A shows a cross sectional configuration of the photodiode in a form of a surface illuminated structure, and FIG. 1B shows a band diagram indicating the conduction band edge and the valence band edge for the diode shown in FIG. 1A.

The photodiode of FIG. 1A comprises a p-type light absorption layer 11, an n-type electrode layer 12, an InP carrier traveling layer 13 provided between the light absorption layer 11 and the electrode layer 12, a p-type carrier block layer 14 provided on an upper side the light absorption layer 11, an anode electrode 15 provided on an upper side of the carrier block layer 14, a cathode electrode 16 covering a part of an upper side of the electrode layer 12, and a semi-insulating substrate 17 provided on a lower side of the electrode layer 12.

The light absorption layer 11 has a doping concentration over a predetermined level so that it is not depleted in a biased state. The carrier traveling layer 13 has a low doping concentration so that it is depleted. It is preferable for the light absorption layer 11 to be neutral in most regions, but a part of the light absorption layer 11 may be depleted. In a case of operating the photodiode, this photodiode of FIG. 1A is reverse biased at about −0.5 V to −2,5 V. However, when the output current level is low, the zero bias may be used instead.

The photresponse in this photodiode of FIG. 1A is as follows.

First, the light incident from the semi-insulating substrate 17 side passes through the n-type electrode layer 12 and the carrier traveling layer 13, and absorbed by the p-type light absorption layer 11. Then, among the generated electrons and holes, the holes directly flow into the anode electrode 15 so that they do not contribute to the induced current in the carrier traveling layer 13 directly.

At this point, the differences between the photodiode of the present invention and the conventional photodiode will be explained.

Figure 9A:
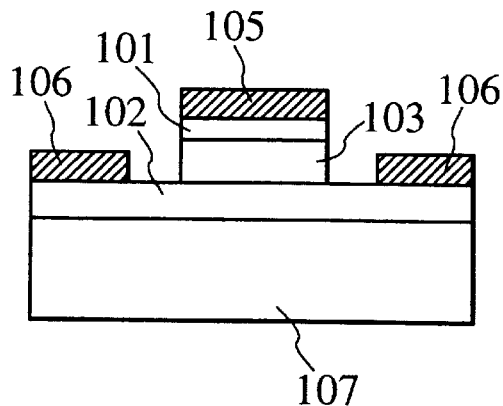
FIGS. 9A and B shows a conventional double heterostructure pin photodiode.
Figure 9B:
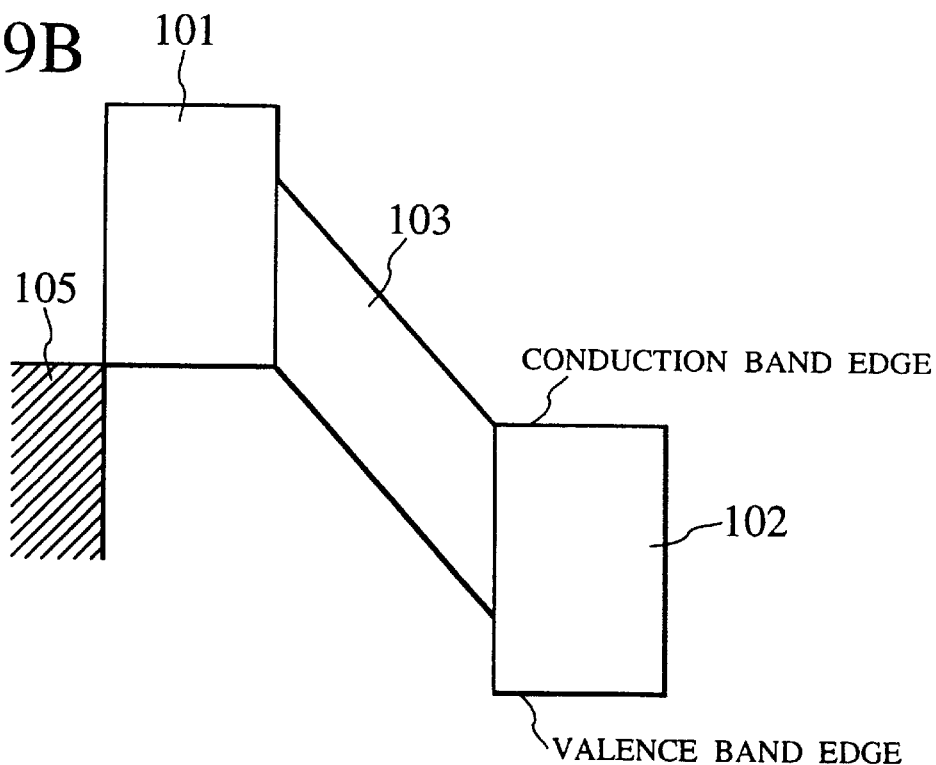

FIG. 9A shows a cross sectional configuration a conventional double heterostructure pin photodiode, and FIG. 9B shows its band diagram. This conventional pin photodiode comprises a p-type electrode layer 101, an n-type electrode layer 102, a carrier traveling layer 103 which is provided between the p-type electrode layer 101 and the n-type electrode layer 102 and which simultaneously acts as a light absorption layer, an anode electrode 105 provide on an upper side of the p-type electrode layer 101, a cathode electrode 106 covering a part of an upper side of the n-type electrode layer 102, and a semi-insulating substrate 107 provided on a lower side of the n-type electrode layer 102.

In this conventional photodiode, the same depleted semiconductor layer is used as the light absorption layer and the carrier traveling layer, so that the equal number of electrons and holes are generated, and while they reach to the n-type electrode layer 102 and the p-type electrode layer 101, respectively, they both generate the induced current in an external circuit. Here, the induced current is generated as a sum of two current components due to the electrons and the holes, which determines the frequency response of the photodiode.

In the compound semiconductor such as InGaAs semiconductor, the drift velocities of these two carriers differ from each other above four to eight times, so that the traveling delay time characteristic is almost entirely determined by the holes which have the slower drift velocity. The 3 dB bandwidth f3 d B can be approximately expressed as:

$$f3\,dB = 3.5/(2\pi\tau h) = 3.5 V_h/(2\pi WT) = 0.56/\tau h \quad (1)$$

where τh is the traveling time of the holes, Vh is the hole drift velocity, and WT is the depletion layer width (see K. Kato et al., "Design of Ultrawide-Band, High-Sensitivity p-i-n Photodetectors" IEICE Trans. Electron., Vol.E76-C, No.2, pp. 214–221, February 1993).

On the other hand, the pin photodiode of the present invention shown in FIG. 1A has a configuration in which the carriers with the slow drift velocity do not directly contribute to the device operation. The light absorption and the carrier traveling are functionally separated, so that the overall light response becomes two stage process of a carrier injection and an induced current generation. When there is no difference in the carrier drift velocities, the response becomes slower than the conventional pin photodiode. However, when there is a difference in the carrier drift velocities over a certain level, the response rather becomes faster by selectively using the carriers with the fast drift velocity (which are electrons in general).

In the following, the operation of the pin photodiode of the present invention will be described. Here, a case of a uniform bandgap in the light absorption layer 11 will be considered. First, among the electrons and holes generated at the light absorption layer 11, the electrons are diffused into the carrier traveling layer 13. The holes merely electrically respond in relation to the movement of the electrons, so as to maintain the light absorption layer charge neutrality condition. This hole response time is that of the dielectric relaxation time which is extremely short. The response time τAbs of the carrier injection into the carrier traveling layer 13 is determined by the diffusion time of the electrons in the light absorption layer 11. By an analogy to the base traveling time of the bipolar transistor, this response time τAbs can be approximately expressed similarly as τ estimated as the base traveling time, that is, as:

$$\tau A = \tau e\,A\,b\,s = [WA\,b\,s^2(2kT\mu e/q)] \propto WA\,b\,s^2 \quad (2)$$

where WAbs is a thickness, τAbs is a traveling time, μe is an electron mobility, k is the Boltzmann constant, T is an absolute temperature, and q is an electron change, in the entire light absorption layer 11. Here, the response time of the light absorption layer is proportional to the square of the layer thickness. From the characteristic of the transfer function: $1/(1+j\omega\tau)$ for the diffusion, the corresponding 3 dB bandwidth f3 d B is given as follows.

$$f3db = 1/(2\pi\tau e\,A\,b\,s) = 0.159/\tau e\,A\,b\,s \quad (3)$$

By comparing this equation (3) with the above equation (1), it can be seen that the conventional photodiode gives a better f3 d B than the photodiode of the present invention when τh and τe A b s are equal to each other, but the photodiode of the present invention gives a far larger f3 d B in a configuration in which the electron diffusion velocity becomes larger than the hole drift velocity.

From the characteristic of the transfer function: $(1-\exp(-j\omega\tau))/(j\omega\tau)$ for the carrier traveling through a capacitor, the response time TT of the carrier traveling layer 13 is expressed as:

$$\tau T = WT/2Ve = (\tfrac{1}{2})\tau e\ T \qquad (4)$$

where Ve is the electron drift velocity, $\tau e\ T$ is the electron traveling time, and WT is the traveling layer width, while the corresponding 3 dB bandwidth f3 d B is given as follows.

$$f3\ d\ B \approx 2.8/(2\pi\tau e\ T) = 0.45/\tau e\ T \qquad (5)$$

By comparing this equation (5) with the above equation (1), it can be seen that the conventional photodiode has the bandwidth which is 3.5/2.4 times wider than the photodiode of the present invention in a case of Vh=Ve. However, this f3 d B relationship is reversed when the electron velocity becomes over 3.5/2.4 times greater than the hole velocity.

Alongside the frequency response, the output amplitude is also an important characteristic index of the pin photodiode. The output saturation is caused by the electric field modulation due to a generation of internal space charges. By using only the electrons as carriers, the higher current density can be allowed as much as the velocity becomes faster with respect to a constant carrier concentration, so that the greater output amplitude becomes possible.

In summary, the major difference between the conventional photodiode and the photodiode of the present invention lies in that the same depletion semiconductor layer is used for the light absorption layer and the carrier traveling layer in the conventional photodiode, whereas the carrier generation and the carrier traveling are separated in the photodiode of the present invention. As a consequence, it becomes possible for the present invention to use only the carriers with the fast traveling velocity, and therefore it is possible to improve the response speed and the output amplitude characteristic.

Figure 2:
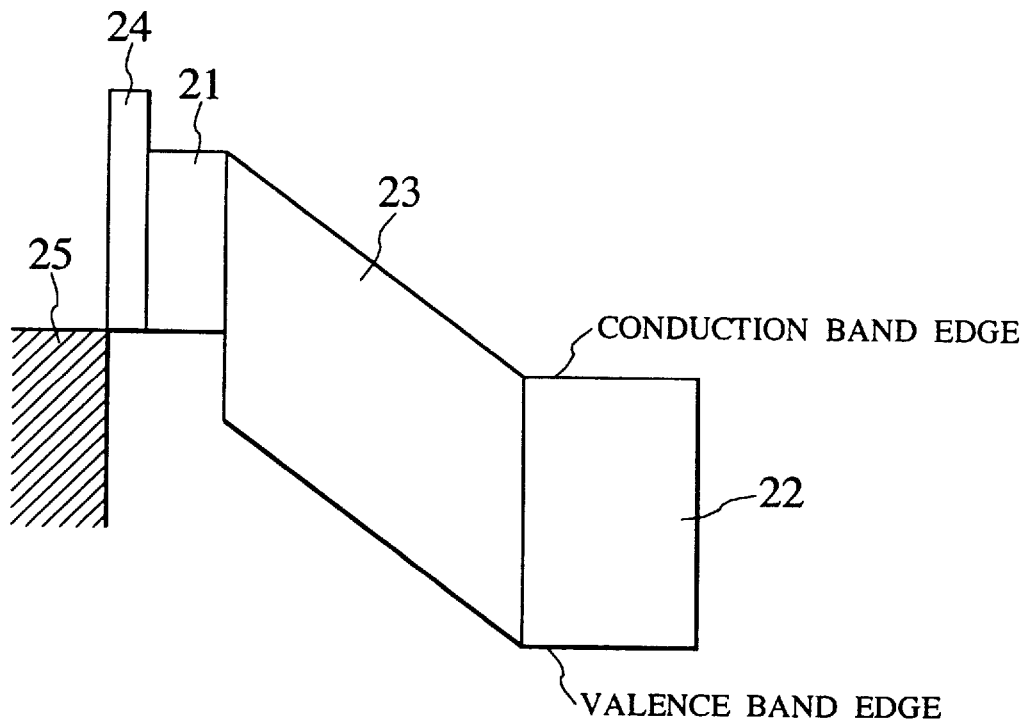
FIG. 2 is a band diagram for a pin photodiode according to the first embodiment of the present invention.

Referring now to FIG. 2, the first embodiment of a pin photodiode according to the present invention will be described in detail.

FIG. 2 shows a band diagram of a photodiode in a surface illuminated structure according to this first embodiment. The photodiode of the first embodiment has a p-type In0.53 Ga0.47 As light absorption layer 21, an n-type InP electrode layer 22, an undoped InP carrier traveling layer 23, a p-type In0.73 Ga0.27 As0.6 P0.4 carrier block layer 24, and an anode electrode 25.

The In0.53 Ga0.47 As light absorption layer 21 has a doping concentration over a predetermined level so that it is not depleted in a biased state. Here, when a potential barrier due to a band discontinuity appears at a boundary of the light absorption layer 21 and the carrier traveling layer 23, it is also possible to apply a localized doping according to the need. The In0.73 Ga0.27 As0.6 P0.4 carrier block layer 24 has a bandgap energy which is greater than that of the the In0.53 Ga0.47 As light absorption layer 21 by 200 meV, so that this carrier block layer 24 blocks the diffusion of the electrons functioning as minority carriers toward the electrode side.

As an example, a case of using the p-type In0.53 Ga0.47 As light absorption layer 21 with the doping concentration $p=2\times10^{17}$ /cm$^2$ will be considered. The response time $\tau A$ under an approximation of a uniform light absorption is: $\tau A=1$ ps, when the electron mobility is $\mu e =8000$ cm$^2$/Vs and the thickness of the light absorption layer 21 is WA b s=0.2 $\mu$m, according to the above equation (2), and the corresponding 3 dB bandwidth is f3 d B=159 GHz, according to the above equation (3). Also, the response time $\tau T$ is: $\tau T=0.25$ ps, when the electron traveling velocity in the InP carrier traveling layer 23 is ve=$4\times10^7$ cm/s and the thickness of the InP carrier traveling layer 23 is WT=0.2 $\mu$gm, according to the above equation (4), and the corresponding 3 dB bandwidth is f3 d B=900 GHz, according to the above equation (5). The overall bandwidth can be calculated as 157 GHz from a relationship of $(1/f3\ d\ B^2)\text{total}=\Sigma(1/f3\ d\ B^2)$ In contrast, for the conventional pin photodiode, when the same traveling layer thickness (which implies the same quantum efficiency) WT=0.2 $\mu$m and the hole velocity in the InGaAs layer vh=$5\times10^6$ cm/s are used, the 3 dB bandwidth can be calculated as f3 d B=140 GHz. Thus, even when the bandgap of the light absorption layer 21 is uniform and the electrons are set to travel only by the diffusion, the photodiode of this first embodiment can obtain the equivalent or superior bandwidth compared with the conventional photodiode.

In this configuration where the semiconductor layer structure is formed by the III–V compound semiconductors, and the light absorption layer 21 and the carrier block layer 24 are p-type while the electrode layer 22 is n-type, it is possible to realize a configuration in which the carrier generation and the carrier traveling can be separated. Consequently it is possible to resolve the conventionally encountered problem that, due to the low hole drift velocity of the direct transition III–V compound semiconductors, the effective carrier traveling velocity is dominated by the hole drift velocity and the carrier traveling time is determined by holes even though the electron drift velocity is fast. According to this first embodiment, it is possible to use only the carriers with the fast traveling velocity, so that it is possible to realize a photodiode with a fast response speed and a superior output amplitude characteristic.

Figure 3:
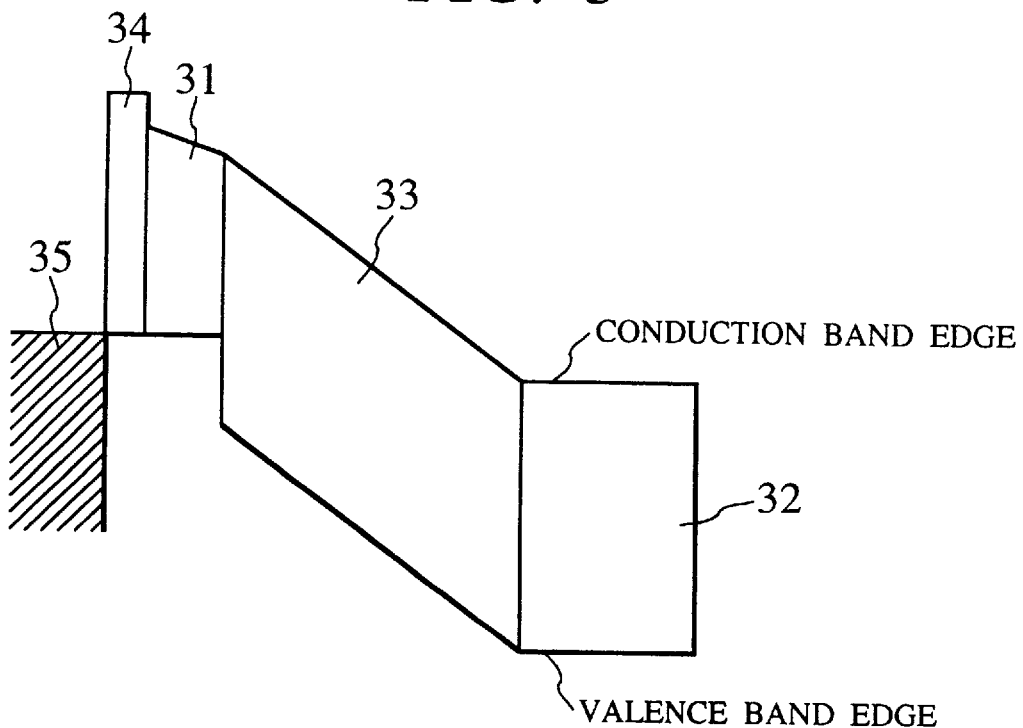
FIG. 3 is a band diagram for a pin photodiode according to the second embodiment of the present invention.
Figure 4:
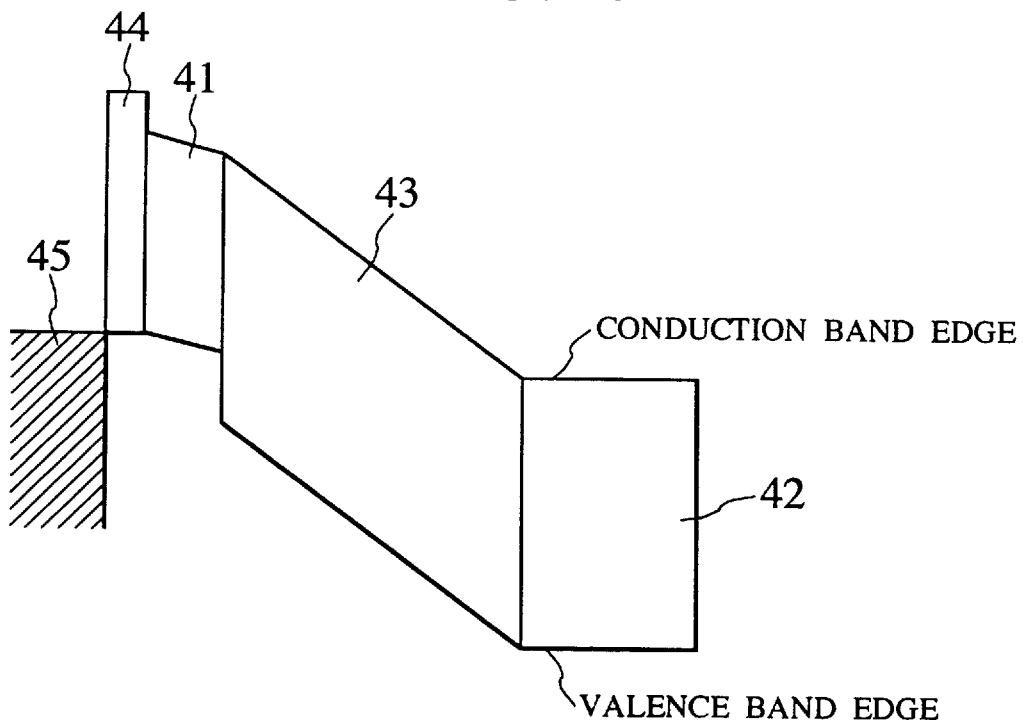
FIG. 4 is a band diagram for a pin photodiode according to the third embodiment of the present invention.

Referring now to FIG. 3 and FIG. 4, the second and third embodiments of a pin photodiode according to the present invention will be described in detail.

FIG. 3 shows a band diagram of a photodiode in a surface illuminated structure according to the second embodiment. The photodiode of the second embodiment has a p-type InGaAsP light absorption layer 31 with graded bandgap, an n-type InP electrode layer 32, an undoped InP carrier traveling layer 33, a p-type In0.73 Ga0.27 As0.6 P0.4 carrier block layer 34, and an anode electrode 35.

The InGaAsP light absorption layer 31 has a doping concentration over a predetermined level so that it is not depleted in a biased state. The InP carrier traveling layer 33 has a low doping concentration so that it is depleted.

In this configuration of FIG. 3 where the light absorption layer 31 has a bandgap graded toward the carrier traveling layer 33, it is possible to generate a quasi-field (an electric field which acts only on the minority carriers at a neutral layer) in the light absorption layer 31, and this quasi-field has an effect of reducing the response time by further accelerating the electrons in the light absorption layer 31 due to the electric field drift, as will be described in further detail below.

FIG. 4 shows a band diagram of a photodiode in a surface illuminated structure according to the third embodiment. The photodiode of the third embodiment has a p-type In0.53 Ga0.47 As light absorption layer 41 with graded doping concentration, an n-type InP electrode layer 42, an undoped InP carrier traveling layer 43, a p-type In0.73 Ga0.27 As0.6 P0.4 carrier block layer 44, and an anode electrode 45.

The In0.53 Ga0.47 As light absorption layer 41 has a doping concentration over a predetermined level so that it is not depleted in a biased state, and this doping concentration is graded toward the carrier traveling layer 43. The InP carrier traveling layer 43 has a low doping concentration so that it is depleted.

In this configuration of FIG. 4 where the light absorption layer 41 has a doping concentration graded toward the carrier traveling layer 43, it is also possible to generate a quasi-field (an electric field which acts only on the minority carriers at a neutral layer) in the light absorption layer 41, and this quasi-field has an effect of reducing the response time by further accelerating the electrons in the light absorption layer 41 due to the electric field drift, as will be described in further detail below.

Now, the second and third embodiments shown in FIG. 3 and FIG. 4 are both directed to a configuration for generating the quasi-field (an electric field which acts only on the minority carriers at a neutral layer) in the light absorption layer. For example, in the configuration of FIG. 3, in order to induce the quasi-field of 5 kV/cm, it is necessary to use the bandgap grading of 100 meV over the light absorption layer thickness WAbs=0.2 $\mu$m, which can be realized in practice by appropriately changing the InGaAsP composition (that is, In/Ga ratio and As/P ratio). Also, in the configuration of FIG. 4, in order to induce the quasi-field of 5 kV/cm, for example, it is necessary to use the Fermi level grading of 100 meV over the light absorption layer thickness WAbs=0.2 $\mu$m, which can be realized in practice by changing the InGaAs doping concentration from one end to another by 47 times.

The quasi-field has an effect of reducing the response time by further accelerating the electrons in the light absorption layer due to the electric field drift. In the approximation in which the drift effect is regarded as dominant over the diffusion, the electron velocity in the light absorption layer is constant, and the traveling time can be expressed as:

$$\tau eAbs = WAbs/(\mu e E\Delta VG/WAbs) \propto WAbs^2 \qquad (6)$$

where WAbs is a thickness, E is an electric field strength, $\Delta$VG is a potential change, and $\mu$e Is the electron mobility, in the light absorption layer. Here, the response time of the light absorption layer is proportional to the square of the layer thickness.

In the approximation of a uniform light absorption, the transfer function (whose derivation is known and therefore omitted here) is given by: $(1-\exp(-j\omega\tau))/(j\omega\tau)$ when only the drift traveling is considered, and the response time $\tau$A is given by:

$$\tau A = \tau eAbs/2 \qquad (7)$$

while the corresponding 3 dB bandwidth f3dB is given as follows.

$$f3dB = 2.8/(2\pi\tau eAbs) = 0.45/\tau eAbs \qquad (8)$$

As an example, when the light absorption layer thickness is WAbs0.2 $\mu$m, the internal electric field is E=2.5 kV/cm, and the electron mobility is $\mu$e=8000 cm$^2$/Vs, the response time $\tau$A can be calculated as: $\tau$A=$\tau$eAbs/2=0.5 Ps, and the corresponding 3 dB bandwidth f3dB can be calculated as: f3dB=2.8/(2$\pi\tau$eAbs)=450 GHz. It can be seen that the response time is improved compared with a case of the first embodiment shown in FIG. 2 (a case of carrier diffusion). When the quasi-field effect is at the same level as the diffusion effect (such as a case of E=2.5 kV/cm, for example), these effects will act in combination, so that the 3 dB bandwidth f3dB is expected to be somewhat smaller than the above noted value in practice.

This effect becomes even more noticeable when a thinner light absorption layer thickness is used. When E=3.5 kV/cm is used, for WAbs=0.14 $\mu$m, the response time $\tau$A can be calculated as: $\tau$A=0.25 ps and the corresponding 3 dB bandwidth f3dB can be calculated as: f3dB=2.8/(2$\pi\tau$eAbs)=900 GHz, so that the considerable improvement can be expected. When the response of the carrier traveling layer in this case is assumed to be the same as in the first embodiment, the overall bandwidth is going to be f3dB=640 GHz.

Figure 5:
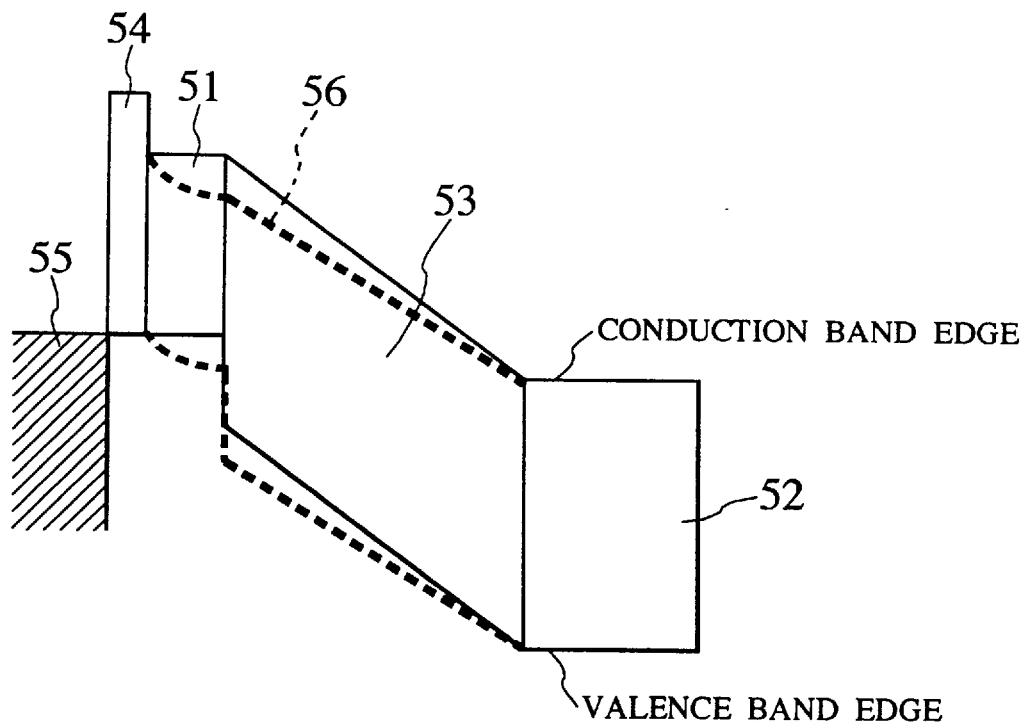
FIG. 5 a band diagram for a pin photodiode according to the fourth embodiment of the present invention.

Referring now to FIG. 5, the fourth embodiment of a pin photodiode according to the present invention will be described in detail.

FIG. 5 shows a band diagram of a photodiode in a surface illuminated structure according to the fourth embodiment. The photodiode of the fourth embodiment has a p-type In0.53 Ga0.47 As light absorption layer 51, an n-type InP electrode layer 52, an undoped InP carrier traveling layer 53, a p-type In0.73 Ga0.27 As0.6 P0.4 carrier block layer 54, and an anode electrode 55.

The In0.53 Ga0.47 As light absorption layer 51 has a doping concentration as described below, while the InP carrier traveling layer 53 has a low doping concentration so that it is depleted. In the operation state (a state in which the current is flowing, that is, a state in which a reverse bias is applied between the light absorption layer 51 and the electrode layer 52), the excess majority carriers are present in a part of the light absorption layer changing the charge neutrality greatly, and the band shape is changed to have a deformed band. profile 56, so as to produce the acceleration electric field with respect to the electrons in the In0.53 Ga0.47 As light absorption layer 51.

Now, this fourth embodiment is directed to a case of adjusting the p-type doping concentration in the light absorption layer according to the current density under the operation, so as to make the photoresponse of the photodiode faster. The configuration of this fourth embodiment is realizable regardless of the use of graded bandgap or doping concentration in the light absorption layer.

To this end, the DC component Jp (X) of the hole a current will be considered now. This DC component linearly changes within the light absorption layer, so that when the hole diffusion is ignored, this DC component can be expressed in terms of the electric field strength E(x), the conductivity $\sigma$, and the diode average current density J0 as:

$$J_p(x) = -\frac{J_0}{W_{Abs}} \times (W_{Abs} - x) = \sigma(x) \times E(x) \qquad (9)$$

Then, the conductivity $\sigma$ (that is, doping concentration) is set so as to generate an appropriate electric field strength E(x) in accordance to the operation condition. Here, however, there is an upper limit to a potential change $\phi$ over the entire light absorption layer. Namely, when the potential change $\phi$ is too large, the energy of the electrons injected into the carrier traveling layer becomes too high, and the electron traveling velocity is rather lowered. For this reason, a suitable range of the potential change $\phi$ is specified as follows.

By integrating both sides of the above equation (9) according to E(x), this equation can be rewritten in terms of the potential change $\phi$ over the entire light absorption layer as follows.

$$\phi = \int_0^{W_{Abs}} \frac{J_\theta(W_{Abs} - x)}{W_{Abs}\sigma(x)} \, dx \tag{10}$$

Also, when the conductivity a is constant, this equation (10) can be simplified as follows.

$$\phi = \frac{J_\theta \times W_{Abs}}{2\sigma} \tag{11}$$

In a case of forming this photodiode of the fourth embodiment by using the III–V compound semiconductors, since the energy relaxation process of electrons is relatively slow, the Γ-valley/L-valley energy separation ΔEr–L (eV) of the conduction band of the carrier traveling layer (which is about 0.5 eV in InP) will be taken as an upper limit for defining the effective range of the potential change φ.

Thus, in general, the desired effect can be obtained by setting the effective range of the potential change φ as:

$$\phi \leq \Delta E r - L/q \tag{12}$$

where q is an electron charge.

Consequently, the conductivity a (the doping concentration) of the light absorption layer is to be set in relation to the light absorption layer thickness WAbs So as to satisfy a relationship of:

$$\frac{J_\theta \times W_{Abs}}{2\sigma} \leq \Delta E_{\Gamma-L}/q \tag{13}$$

or when the conductivity σ has a distribution, a relationship of:

$$\int_0^{W_{Abs}} \frac{J_\theta(W_{Abs} - x)}{W_{Abs}\sigma(x)} \, dx \leq \Delta E_{\Gamma-L}/q \tag{14}$$

according to this fourth embodiment.

Here, the conductivity a may not necessarily be uniform over the entire light absorption layer. By appropriately setting the conductivity (doping concentration) of the light absorption layer, it is possible to generate the self induced electric field for flowing the self-controlled the hole current in the light absorption layer at the operation state (a state where the current is flowing). This self induced electric field acts on the electrons at the same time, so that the electrons in the light absorption layer are accelerated due to the drift as long as the above specified range is satisfied, and there is no adverse effect on the response of the carrier traveling layer either. Consequently, It is possible for this fourth embodiment to reduce the response time of the photodiode as a whole.

Figure 6:
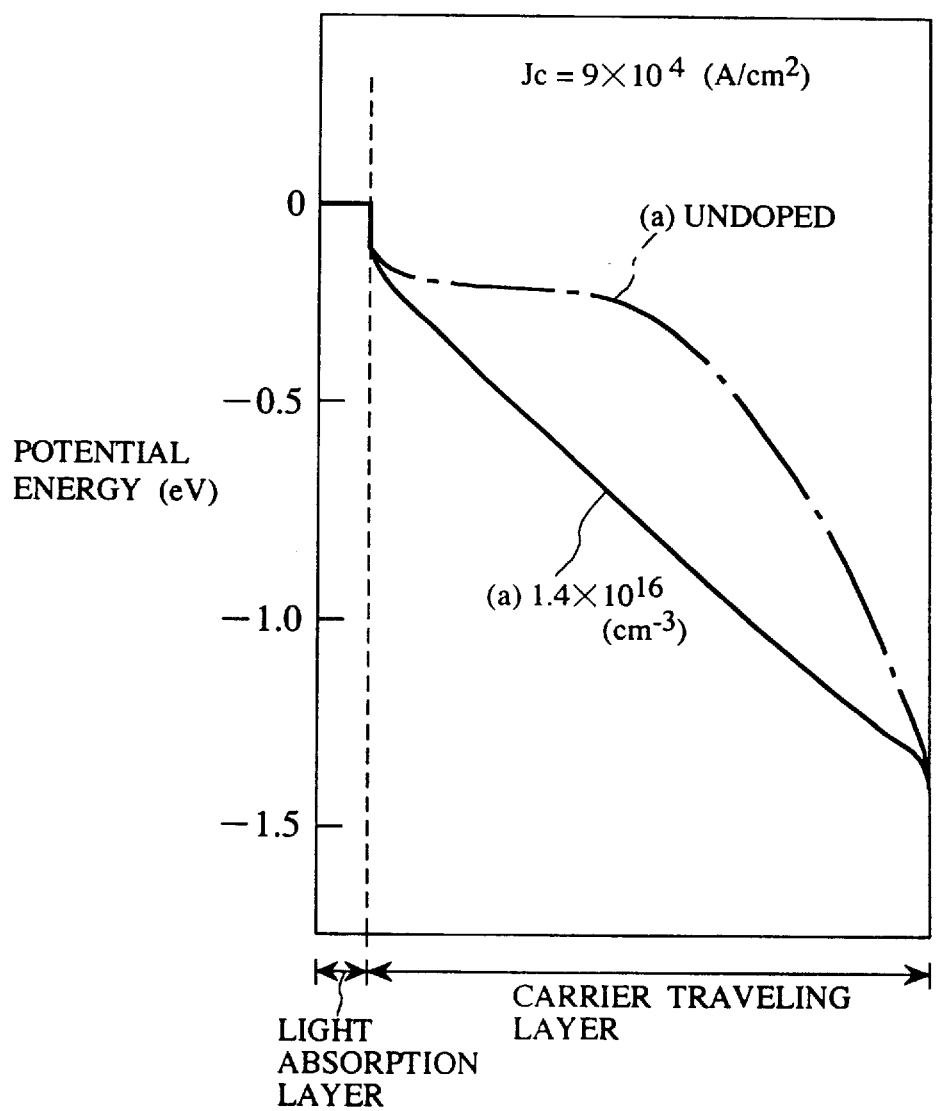
FIG. 6 is a graph showing a simulation result for a potential distribution in a carrier traveling layer of a pin photodiode according to the fifth embodiment of the present invention.
Figure 7:
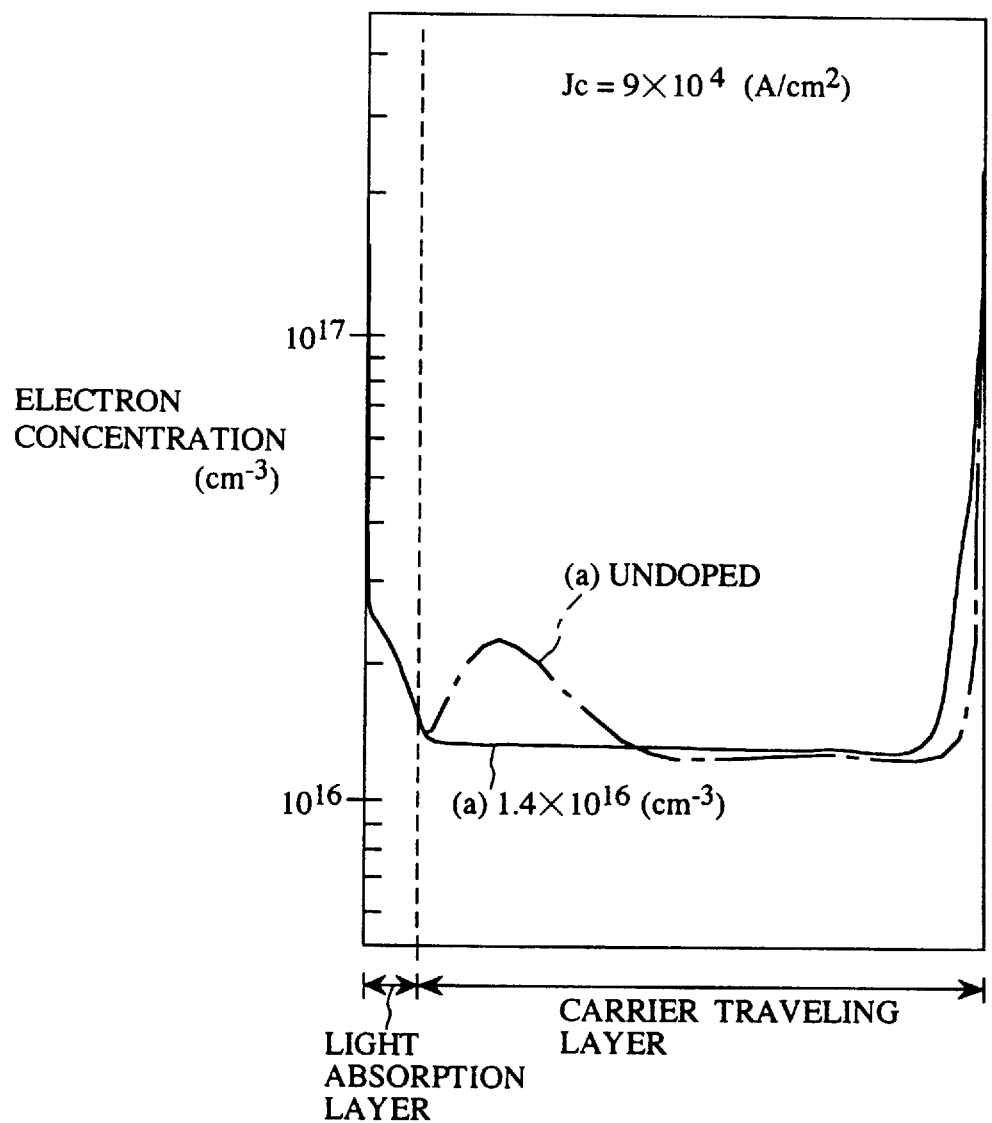
FIG. 7 is a graph showing a simulation result for a electron distribution in a carrier traveling layer of a pin photodiode according to the fifth embodiment of the present invention.

Referring now to FIG. 6 and FIG. 7, the fifth embodiment of a pin photodiode according to the present invention will be described in detail.

Curves (a) in FIG. 6 and FIG. 7 show the results of simulation based on the drift diffusion for the potential distribution and the electron concentration distribution respectively, in a case of using the optical pumping current density of 9×10⁴ [A/cm²] for an undoped InP layer for constituting the carrier traveling layer. As can be seen, the neutral region is effectively extended from the light absorption layer and the depletion region contracts because of the electron space charges (which is called the Kirk effect), so that the junction capacitance becomes large. An influence of the Kirk effect can be made weakened by lowering the operation current density, by sacrificing the fast operation characteristic of the device, but the Kirk effect is not going to disappear completely even when the operation current density is quite low.

In contrast, in this fifth embodiment, impurity conduction type and concentration of the doping impurity in a region constituting the carrier traveling layer when depleted are set equal to the carrier charge and the carrier concentration during the operation using the predetermined desired optical pumping current density, so that an influence of space charges does not appear in the operation state and a thickness of the depletion layer can be made as thick as possible according to the layer structure design.

In other words, in this fifth embodiment, the impurities to be doped into the semiconductor layer constituting the carrier traveling layer is set to be donor impurities when the carriers are electrons, or acceptor impurities when the carriers are holes, and their impurity concentration is set as follows.

In the InP/InGaAs hetero-junction bipolar transistor, the electron traveling velocity in the collector is about $4\times10^7$ [cm/s] on average due to the velocity overshoot (see, IEEE Transactions on Electron Devices, Vol.40, No.11, pp.1950–1956, November 1993). Therefore, in the carrier traveling layer of this fifth embodiment, the electron velocity is assumed to be constant at $4\times10^7$ [cm/s]. Then, in order to operate the device properly, at an optical pumping current density of $9\times10^4$ [A/cm³], the electron concentration should be $1.4\times10^{16}$ [/cm³] in the carrier traveling layer.

Curves (b) in FIG. 6 and FIG. 7 show the results of simulation based on the drift diffusion model for the potential distribution and the electron concentration distribution respectively, in a case of using the optical pumping current density of $9\times10^4$ [A/cm²] and the doping impurity concentration of $1.4\times10^{16}$ [/cm³] for a region constituting the carrier traveling layer according to this fifth embodiment. Note that the Kirk effect usually becomes noticeable when the optical pumping current density is over $2\times10^4$ [A/cm³], so that the simulation using the optical pumping current density of $9\times10^4$ [A/cm²] were conducted.

As can be seen, the potential distribution is nearly linear throughout the entire region of the carrier traveling layer, and the electron distribution is nearly uniform over the carrier traveling layer. In addition, there is no electron accumulation occurring in the carrier traveling layer. These simulated results imply that it is possible to control the thickness of the depletied carrier traveling layer to the thickness of the original one as the Kirk effect is suppressed in the operation state.

Note that, a setting of the optical pumping current density in the operation state equal to $9\times10^4$ [A/cm³] as described above is only an example, and can be changed to any desired setting, and it suffices to determine the carrier concentration in the carrier traveling layer in proportion to the setting value used. The carrier concentration n to realize the current density Jc [A/cm²] can be expressed as n=Jc/qv, where q is an electron charge and v is a carrier velocity, and the carrier velocity v is approximately equal to the saturation velocity, in a case of using the current density for which the Kirk effect becomes noticeable. Consequently, in the compound semiconductor for which the saturation velocity is equal to $4\times10^7$ [cm/s], the impurity concentration for the carrier traveling layer should be approximately equal to $1.56\times10^{11} \times Jc$ [/cm³].

Also, the electron velocity in the carrier traveling layer is assumed to be constant in the above, but when the detailed velocity distribution is available, it is effective to set the carrier concentration distribution in the carrier traveling layer to be inversely proportional to the velocity distribution, so as to make the impurity concentration distribution identical to the electron distribution at a time of using the desired optical pumping current density.

One significant advantage of using the photodiode of the present invention is a capability of handling high light power signals in the photodiode and using the high output signals of the photodiode as input signals to a digital circuit directly without amplification. According to this fifth embodiment, when the optical pumping current density of the photodiode becomes large in such a case, similarly as in the Kirk effect of the bipolar transistor (see, IRE Transactions on Electron devices, ED-9, pp.164–174, 1962), it is possible to prevent the reduction of the thickness of the depletion layer due to an influence of space charges and the reduction of the diode capacitance can lower the operation speed.

As described above, according to the photodiode configuration of the present invention, it is possible to prevent holes with the slow drift velocity from contributing to the current generation, so that it becomes possible to realize a photodiode with faster and higher current density operation compared with the conventional photodiode using both electrons and holes as carriers. In particular, the photodiode of the present invention can realize a significant improvement in response characteristic, in an application to the so called ultrafast photodiode.

In a case of using a typical light absorption layer (0.2 μm thickness) which has a constant bandgap, it is possible to expect the bandwidth limit of 157 GHz as compared to 140 GHz of the conventional photodiode.

Also, in a case of using a light absorption layer (0.14 μm thickness) with a configuration for generating the quasi-field therein, it is possible to expect the bandwidth limit of 640 GHz.

In addition, the electric field modulation in the carrier traveling layer due to the carrier space changes can be suppressed in inverse proportion to the electron velocity/hole velocity, so that the higher current density can be allowed and the higher saturation output can be realized.

The basic advantage of the photodiode of the present invention lies in its fast operation, so that the photodiode of the present invention can be effectively utilized for detection of light signals of 100 Gb/s or more. The advantage regarding the high saturation output can contribute to the improvement of the error bit rate in the receiver of the optical communication systems.

It is to be noted that the embodiments described above are all directed to a case of a pin photodiode in a surface illuminated structure using mainly InGaAsP type materials, but it is also possible to apply the present invention to a pin photodiode in a waveguide structure, and it is also possible to use the other III–V compound semiconductor materials instead of InGaAsP type materials.

Figure 8:
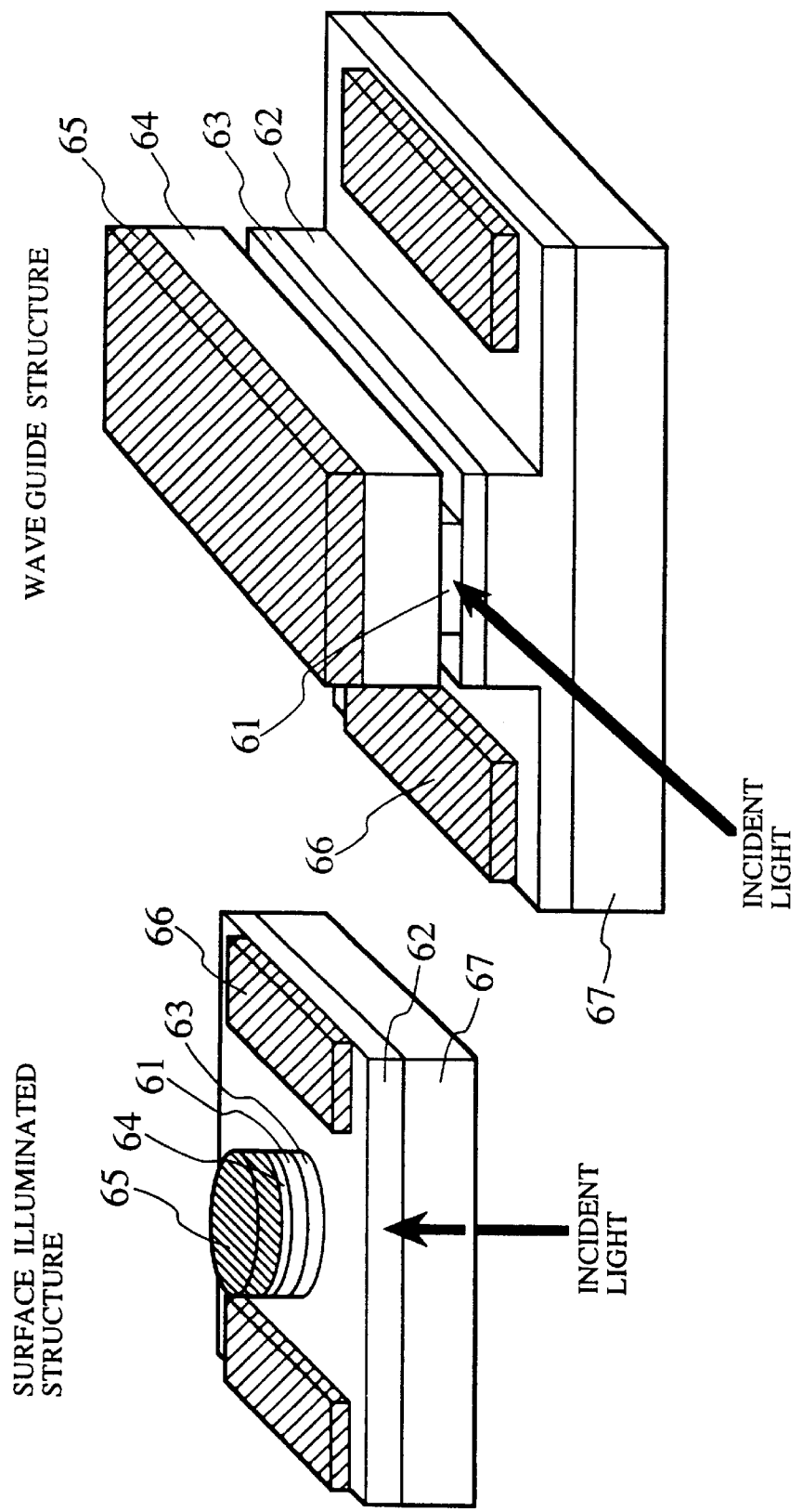
FIG. 8 perspective view of a pin photodiode in a surface illuminated structure and a pin photodiode in a waveguide structure according to the present invention.

For example, FIG. 8 shows a pin photodiode in a surface illuminated structure and a pin photodiode in a waveguide structure according to the present invention, which have corresponding configurations. Namely, both photodiodes comprise a p-type light absorption layer 61, an n-type electrode layer 62, an InP carrier traveling layer 63 provided between the light absorption layer 61 and the electrode layer 62, a p-type carrier block layer 64 provided on an upper side the light absorption layer 61, an anode electrode 65 provided on an upper side of the carrier block layer 64, a cathode electrode 66 covering a part of an upper side of the electrode layer 62, and a semi-insulating substrate 67 provided on a lower side of the electrode layer 62. In the surface illuminated structure, the incident light enters from the side of the substrate 67, whereas in the waveguide structure, the incident light enters along the waveguide direction.

It is also to be noted that, besides those already mentioned above, many modifications and variations of the above embodiments may be made without departing from the novel and advantageous features of the present invention. Accordingly, all such modifications and variations are intended to be included within the scope of the appended claims.

What is claimed is:

1. A pin photodiode with a semiconductor pn junction structure, comprising:

a first semiconductor layer in a first conduction type;

a second semiconductor layer in a second conduction type;

a third semiconductor layer sandwiched between the first and second semiconductor layers, having a doping concentration lower than those of the first and second semiconductor layers;

a fourth semiconductor layer in the first conduction type, provided at one side of the first semiconductor layer opposite to a side at which the third semiconductor layer is provided; and a cathode electrode and an anode electrode connected directly or indirectly to the second semiconductor layer and the fourth semiconductor layer, respectively;

wherein the first semiconductor layer has a bandgap energy by which a charge neutrality condition is maintained in at least a part of the first semiconductor layer and the first semiconductor layer is made to function as a light absorption layer;

the second and third semiconductor layers have bandgap energies by which the second and third semiconductor layers are made not to function as a light absorption layer; and the fourth semiconductor layer has a bandgap energy greater than that of the first semiconductor layer.

2. The pin photodiode of claim 1, wherein a semiconductor layer structure formed by the first, second, third and fourth semiconductor layers is formed by III–V compound semiconductors, and the first conduction type is a p-type while the second conduction type is an n-type.

3. The pin photodiode of claim 1, wherein the first semiconductor layer has at least one of a bandgap energy and a doping concentration graded toward the third semiconductor layer.

4. The pin photodiode of claim 1, wherein when majority carriers are present in a part of the first semiconductor layer under an operation state in which a reverse bias is applied between the first and second semiconductor layers, and an average current density J0 in the operation state is given, the first semiconductor layer has a constant conductivity a and a layer thickness W which satisfy a relationship of:

$$\frac{J_0 \times W}{2\sigma} \leq \Delta E_{\Gamma\text{-}L}/q$$

or when the conductivity σ has a distribution, a relationship of:

$$\int_0^W \frac{J_0(W-x)}{W\sigma(x)} dx \leq \Delta E_{\Gamma\text{-}L}/q$$

where ΔEr–L is a Γ-valley/L-valley energy separation, q is an electron charge, and x is a position in the first semiconductor layer.

5. The pin photodiode of claim 1, wherein impurities doped into the third semiconductor layer is donor impurities when carriers traveling through the third semiconductor layers are electrons, or acceptor impurities when carriers traveling through the third semiconductor layers are holes, and the doping concentration of the third semiconductor layer is set equal to a carrier concentration in the third semiconductor layer in a case of using a desired optical pumping current density.

6. The pin photodiode of claim 1, wherein impurities doped into the third semiconductor layer is donor impurities and carriers traveling through the third semiconductor layer are electrons, and a carrier concentration in the third semiconductor layer is set to Jc/qv, where Jc is an optical pumping current density in the third semiconductor layer, v is an electron traveling velocity, and q is an electron charge.

7. The pin photodiode of claim 1, wherein the third semiconductor layer is formed by InP semiconductor material, and when an optical pumping current density Jc [A/cm$^2$] is given and a velocity of electrons traveling through the third semiconductor layer is $4\times10^7$ [cm/s], a carrier concentration in the third semicondutor layer is set to $1.56\times10^{11}\times$Jc [/cm$^3$].

* * * * *